(12) United States Patent
Mori et al.

(10) Patent No.: US 10,145,022 B2
(45) Date of Patent: Dec. 4, 2018

(54) CRYSTAL GROWTH APPARATUS AND CRYSTAL PRODUCTION METHOD

(71) Applicants: OSAKA UNIVERSITY, Osaka (JP); Panasonic Corporation, Osaka (JP)

(72) Inventors: Yusuke Mori, Osaka (JP); Mamoru Imade, Osaka (JP); Shinsuke Komatsu, Osaka (JP); Michirou Yoshino, Osaka (JP)

(73) Assignees: Osaka University, Osaka (JP); Panasonic Corporation, Osaka (JP)

( * ) Notice: Subject to any disclaimer, the term of this patent is extended or adjusted under 35 U.S.C. 154(b) by 0 days.

(21) Appl. No.: 15/622,427

(22) Filed: Jun. 14, 2017

(65) Prior Publication Data

US 2017/0362735 A1 Dec. 21, 2017

(30) Foreign Application Priority Data

Jun. 16, 2016 (JP) ................................ 2016-119959

(51) Int. Cl.
*C30B 9/12* (2006.01)
*C30B 35/00* (2006.01)
*C30B 29/40* (2006.01)

(52) U.S. Cl.
CPC .............. *C30B 9/12* (2013.01); *C30B 29/406* (2013.01); *C30B 35/00* (2013.01)

(58) Field of Classification Search
CPC combination set(s) only.
See application file for complete search history.

(56) References Cited

U.S. PATENT DOCUMENTS

| 2,424,273 A | * | 7/1947 | Hass, Jr. | .................. C30B 7/08 117/206 |
| 3,827,399 A | * | 8/1974 | Kobayasi | .............. C30B 19/061 117/59 |

FOREIGN PATENT DOCUMENTS

JP 2010-269968 12/2010

* cited by examiner

*Primary Examiner* — Erin F Bergner
(74) *Attorney, Agent, or Firm* — Wenderoth, Lind & Ponack, L.L.P.

(57) ABSTRACT

A crystal growth apparatus includes: a raw material supplying part that mixes raw materials including a group III element metal and an alkali metal; a growing part disposed at a stage under the raw material supplying part, the growing part having a seed substrate; a tilting mechanism that tilts the raw material supplying part and the growing part; a heater that heats the raw material supplying part and the growing part; a control part that controls an operation of the tilting mechanism; and a supply port that supplies a nitrogen element-containing substance to the growing part, wherein the raw material supplying part having an opening facing to the growing part, the opening being disposed at a bottom portion and one edge portion of the raw material supplying part, and the control part controls the tilting mechanism so as to tilt the raw material supplying part toward the other edge portion on the side opposite to the one edge portion so as to prevent the raw materials from entering the opening when the raw materials are mixed, and the control part controls the tilting mechanism so as to tilt the raw material supplying part toward the one edge portion so that the raw materials drop through the opening to the growing part when the mixing of the raw materials is completed.

5 Claims, 16 Drawing Sheets

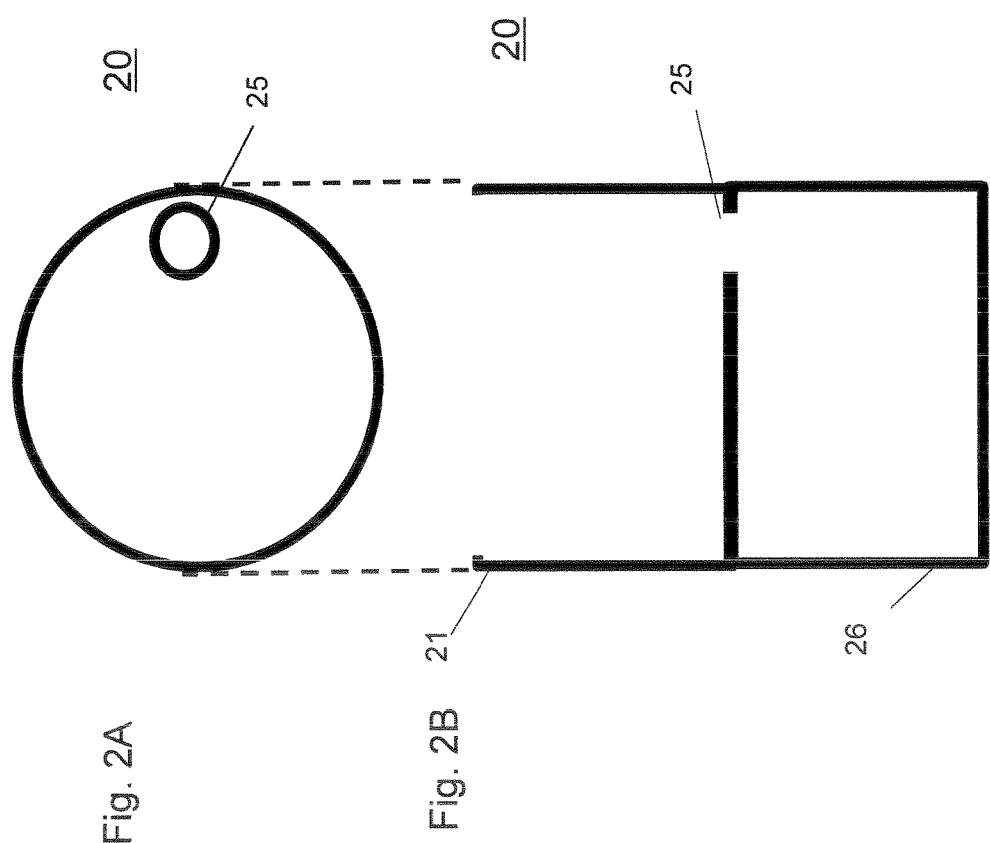

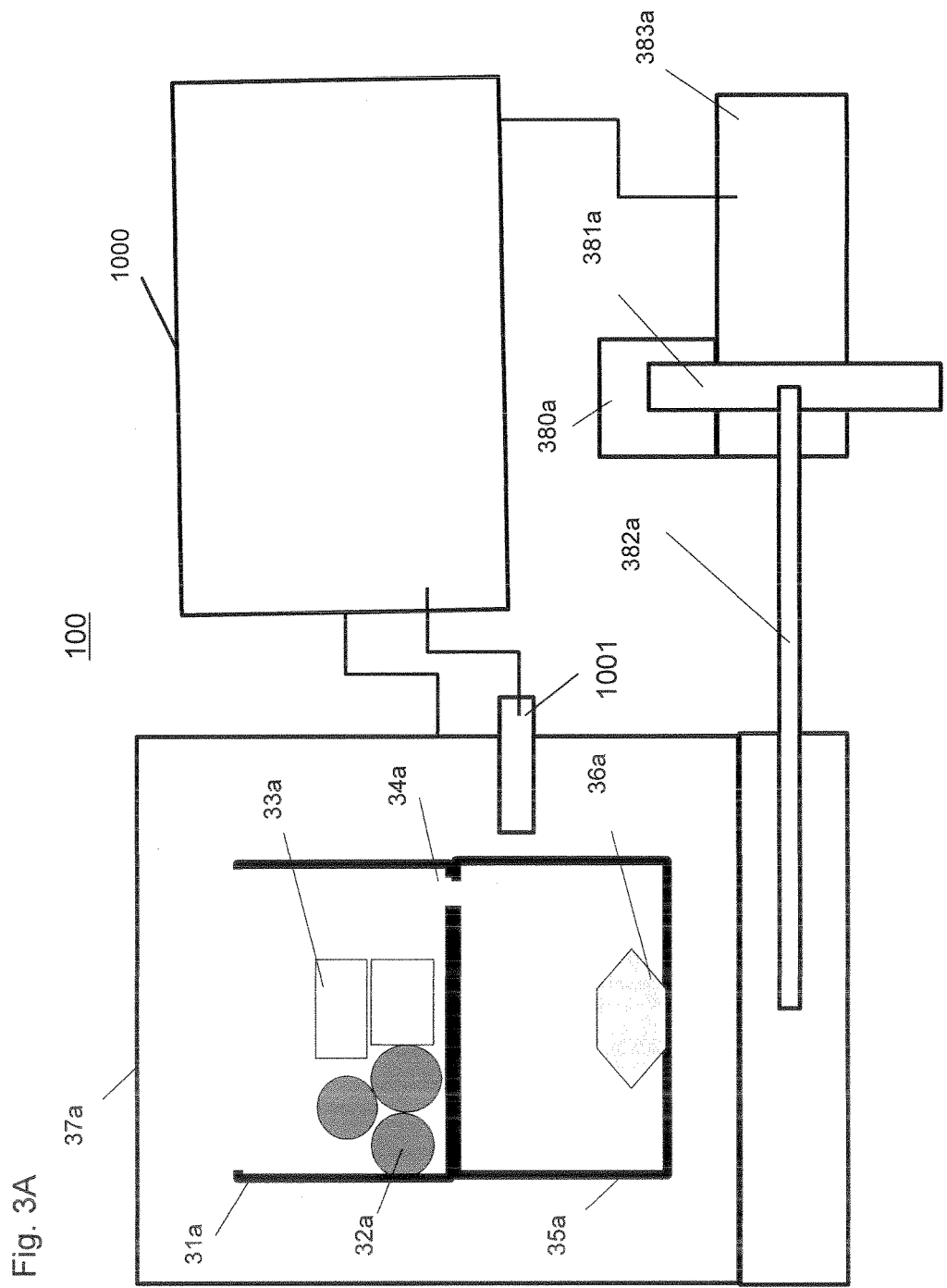

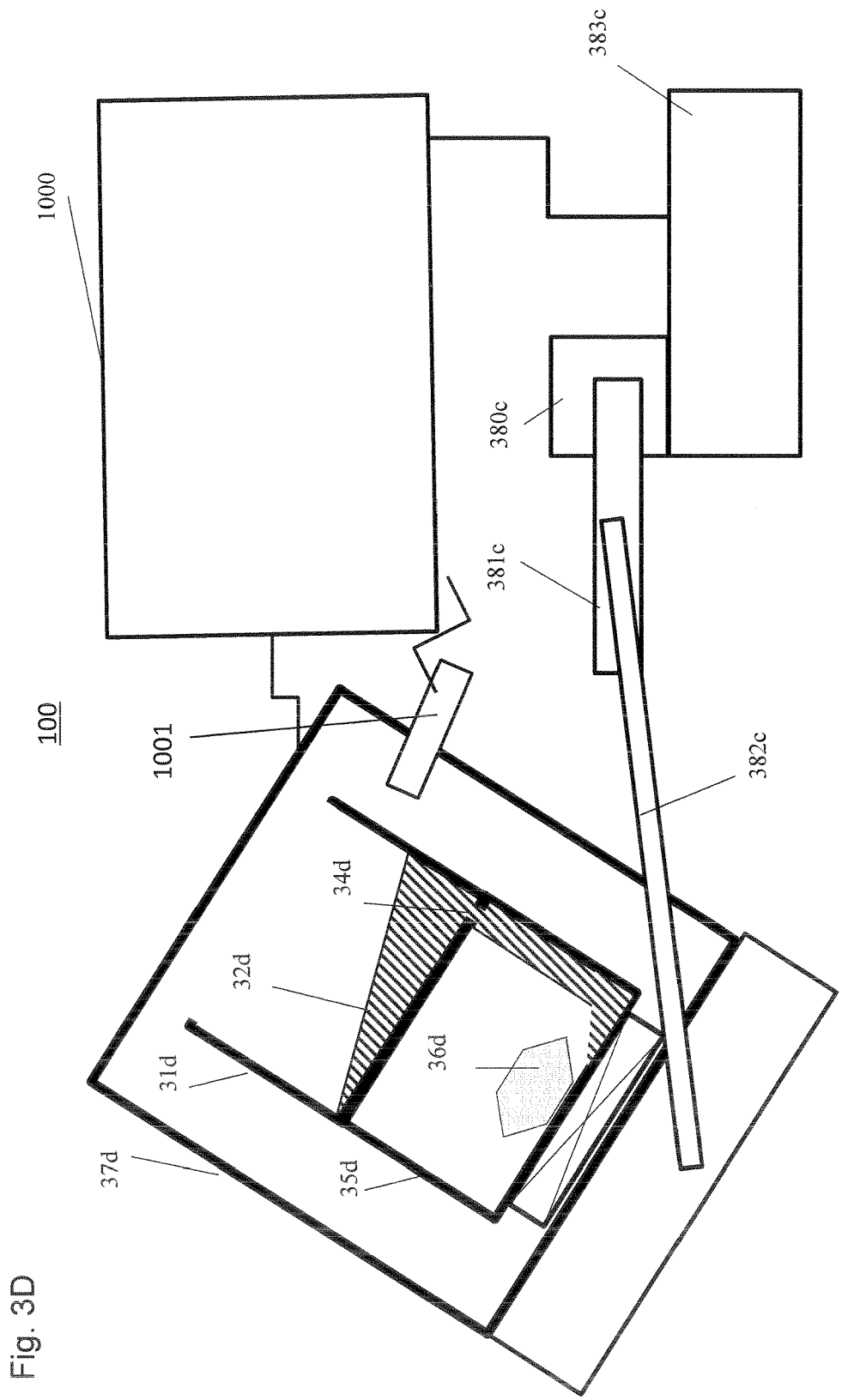

CRYSTAL GROWTH APPARATUS AND CRYSTAL PRODUCTION METHOD

CROSS-REFERENCE TO RELATED APPLICATIONS

This application claims priority of Japanese Patent Application No. 2016-119959 filed on Jun. 16, 2016, the contents of which is incorporated herein by reference.

BACKGROUND OF THE INVENTION

(1) Field of the Invention

The present disclosure relates to a crystal growth apparatus and a crystal production method.

(2) Description of Related Art

A blue LED element used as a display device or a wide bandgap semiconductor GaN used as a material for a power device such as a vehicle-mounted device is attracting attention in recent years. Particularly, it is expected that GaN is applied to a device controlling a large electric power as a power device and GaN has superior performance such as high withstand voltage and high temperature resistance characteristics as compared to currently commercially available Si.

A crystal growth method for GaN using an Na flux method is known as a production method, as shown in Japanese Laid-Open Patent Publication No. 2010-269968 (e.g., Patent Document 1). In this method, Na (sodium) and Ga (gallium) are melted and kept at high temperature (800° C. to 900° C.) and are reacted with nitrogen under pressure of several tens of atmosphere to grow crystals.

SUMMARY OF THE INVENTION

However, when crystals are grown by such a method, a growth defect occurs in a plane.

The present disclosure is conceived in view of the situations and it is an object thereof to provide a crystal growth apparatus and a crystal production method capable of reducing in-plane growth defects in crystal growth so as to uniformly grow crystals.

In one general aspect, the techniques disclosed here feature: a crystal growth apparatus including:

a raw material supplying part that mixes raw materials including a group III element metal and an alkali metal;

a growing part disposed at a stage under the raw material supplying part, the growing part having a seed substrate;

a tilting mechanism that tilts the raw material supplying part and the growing part;

a heater that heats the raw material supplying part and the growing part;

a control part that controls an operation of the tilting mechanism; and a supply port that supplies a nitrogen element-containing substance to the growing part, wherein the raw material supplying part having an opening facing to the growing part, the opening being disposed at a bottom portion and one edge portion of the raw material supplying part, and the control part controls the tilting mechanism so as to tilt the raw material supplying part toward the other edge portion on the side opposite to the one edge portion so as to prevent the raw materials from entering the opening when the raw materials are mixed, and the control part controls the tilting mechanism so as to tilt the raw material supplying part toward the one edge portion so that the raw materials drop through the opening to the growing part when the mixing of the raw materials is completed.

As described above, according to the crystal growth apparatus of the present disclosure, by configuring the raw material supplying part and the seed substrate growing part on the upper and lower stages, the raw materials can appropriately be mixed, and initial growth can properly be performed. As a result, in-plane growth defects can be reduced to uniformly grow crystals in the plane.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

The present disclosure will become readily understood from the following description of non-limiting and exemplary embodiments thereof made with reference to the accompanying drawings, in which like parts are designated by like reference numeral and in which:

FIG. 2A is a plan view of a crucible having an upper and lower two-stage structure according to a first embodiment;

FIG. 2B is a side sectional view of the crucible having the upper and lower two-stage structure;

FIG. 3A is a side sectional view of a state in which raw materials 32a, 33a are set in a two-stage structure crucible of a crystal growth apparatus 100;

FIG. 3D is a side sectional view of a dropping and growing process using the two-stage structure crucible;

DETAILED DESCRIPTION

Figure 1:
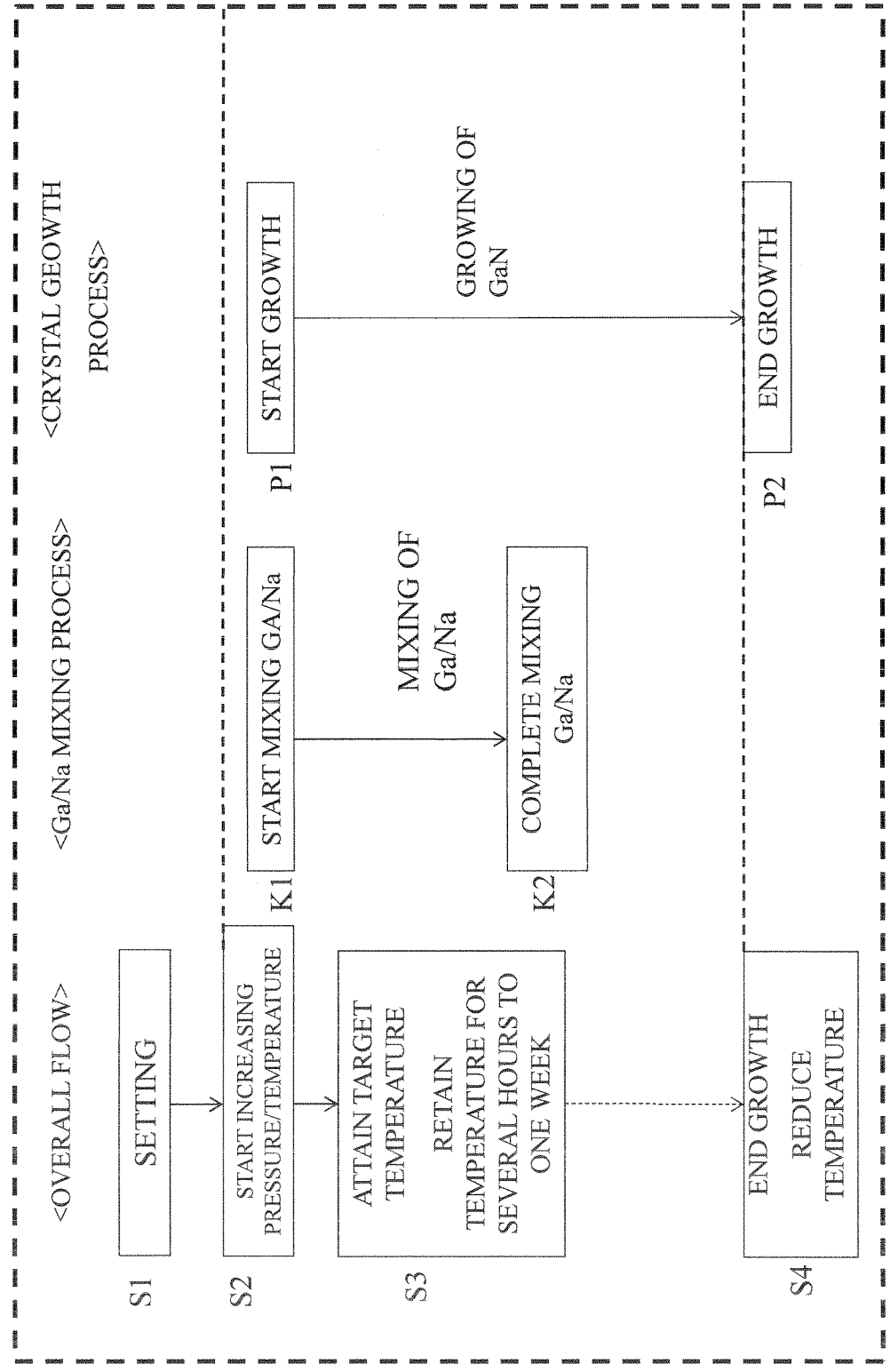
FIG. 1 is flow charts of an overall flow of a GaN growth process with a referential Na flux method, a Ga/Na mixing process, and a crystal growth process.

According to a first aspect, a crystal growth apparatus including:

a raw material supplying part that mixes raw materials including a group III element metal and an alkali metal;

a growing part disposed at a stage under the raw material supplying part, the growing part having a seed substrate;

a tilting mechanism that tilts the raw material supplying part and the growing part;

a heater that heats the raw material supplying part and the growing part;

a control part that controls an operation of the tilting mechanism; and a supply port that supplies a nitrogen element-containing substance to the growing part, wherein the raw material supplying part having an opening facing to the growing part, the opening being disposed at a bottom portion and one edge portion of the raw material supplying part, and the control part controls the tilting mechanism so as to tilt the raw material supplying part toward the other edge portion on the side opposite to the one edge portion so as to prevent the raw materials from entering the opening when the raw materials are mixed, and the control part controls the tilting mechanism so as to tilt the raw material supplying part toward the one edge portion so that the raw materials drop through the opening to the growing part when the mixing of the raw materials is completed.

According to a second aspect, a crystal production method including:

preparing a crystal growth apparatus including: a raw material supplying part that mixes raw materials including a group III element metal and an alkali; a growing part disposed at a stage under the raw material supplying part, the growing part having a seed substrate; a tilting mechanism that tilts the raw material supplying part and the growing part; a heater that heats the raw material supplying part and the growing part; a control part that controls an operation of the tilting mechanism; and a supply port that supplies a nitrogen element-containing substance to the growing part, wherein the raw material supplying part having an opening facing to the growing part, the opening being disposed at a bottom portion and one edge portion of the raw material supplying part, tilting the raw material supplying part toward the other edge portion on the side opposite to the one edge portion so as to prevent the raw materials from entering the opening when the raw materials are mixed, and tilting the raw material supplying part toward the one edge portion so that the raw materials drop through the opening to the growing part when the mixing of the raw materials is completed.

Further, as a crystal production method of a third aspect, in the second aspect, wherein the crystal growth apparatus further includes a uniform dropping structure part between the raw material supply part and the growing part, and the uniform dropping structure part has a plurality of crucible openings, and the crystal growth apparatus causes the tilting mechanism to swing the uniform dropping structure part such that after the raw materials are dropped through the opening to the uniform dropping structure part, the dropped raw materials are supplied through the plurality of crucible openings to the growing part.

Further, as a crystal production method of a fourth aspect, in the third aspect, wherein the diameters of the plurality of crucible openings become smaller as a distance from the center of the uniform dropping structure part increases.

Further, as a crystal production method of a fifth aspect, in the second aspect, wherein the Group III element metal is Ga, and the alkali metal is Na.

A crystal growth apparatus and a crystal production method according to embodiments will now be described with reference to the accompanying drawings. In the drawings, substantially the same members are denoted by the same reference numerals.

First Embodiment

First, the inventors' knowledge on the prior art will be provided as a supplement. Crystals of GaN essentially grow into hexagons; however, in the referential method, some or most of them are chipped without growing. Alternatively, variations in growth of GaN also locally occurs, resulting in variations in optical and electrical performances. A reason for these defects is that a method of mixing Na and Ga during GaN crystal growth and a method of dropping onto a substrate are not appropriate.

A problem of a GaN growth process with an Na flux method will be described with reference to FIG. 1. FIG. 1 is flowcharts of an overall flow of the GaN growth process with a referential Na flux method, a Ga/Na mixing process, and a crystal growth process.

In accordance with a method already described, Ga and Na are set in a crucible and increased in temperature with a constant pressure applied. For example, if the increased temperature is set to 900° C., the temperature inside a pressure vessel is increased over about 1 hour. As the temperature rises, the pressure becomes higher in accordance with Boyle-Charles' law and is therefore set lower than the growth pressure. When 900° C. is attained, the temperature and the pressure are kept constant. This keeping time is considered as a growth period and the temperature and the pressure are retained for a period of several hours to one week. Because of a nitrogen atmosphere under high pressure, nitrogen enters the liquid Na, Ga, and binds to Ga near a seed substrate, and GaN is formed.

When the temperature is increased from normal temperature to 900° C., a mixing process of Ga, Na as shown in FIG. 1 is started. Ga having the melting point of about 30° C. and Na having the melting point of about 100° C. do not enter an alloy state with each other until near 100 to 600° C. and are present in the form of an intermetallic compound. When exceeding a temperature around 600° C., Ga and Na are both ionized and turned into a so-called alloy state of being mixed with free electrons.

The temperature rise to 600° C. takes about 40 minutes and the mixing described above is then started. The mixing occurs due to heat convection and diffusion of Ga/Na liquid metal, and it is thought that several hours to one day are required if no stirring is applied from the outside. The temperature rising time is about 1 hour, and the mixing takes 40 minutes to one day from the start of temperature rise.

On the other hand, as the temperature rises, the crystal growth process is also started. Although the growth begins at 800° C. or higher, it is empirically found that crystal growth starts in a few minutes, and initial supply conditions of Ga and nitrogen is extremely important. Specifically, at the start of crystal growth, uniformity of material supply from Ga, Na is important, and the initial state of crystal growth is determined at this point.

If crystals are non-uniformly grown in the initial period of the crystal growth, the crystals grown for a long time as described above have defects such as voids, polycrystals, etc.

In this case, an overlap of the mixing process and the growth process poses a problem. Although the mixing occurs at 600° C. or more as described above and takes a day before completion, the crystal growth also starts in a non-uniform mixed state, and the initial growth state is determined. If the mixing is non-uniform, Ga is three-dimensionally non-uniform and is not uniformly supplied to the substrate. Similarly, nitrogen is not uniformly contained in the Na—Ga alloy and is not uniformly supplied to the substrate. As a result, in the process of the referential Na flux method of FIG. 1, the GaN crystal growth becomes non-uniform and the growth defect occurs.

Ideally, crystal growth is started at the stage when mixing of Ga and Na is completed; however, in the method of FIG. 1, mixing and crystal growth are performed in an overlapping manner, so that the crystal growth cannot be started after completion of mixing of Ga and Na as described above.

The present inventor invented a crystal growth apparatus and a crystal production method for separating a mixing mechanism and a growth mechanism so as to solve the growth defect problem described above.

FIG. 2A is a plane view of a crucible 20 having an upper and lower two-stage structure according to the first embodiment of the present invention, and FIG. 2B is a side sectional view of the crucible having the upper and lower two-stage structure. The overall control of a crystal growth apparatus 100 shown in FIG. 3A and the control of operations of constituent elements are provided by a control part 1000. The control part 1000 includes a processor or a control circuit storing a predetermined program so that each mechanism performs an operation described later.

As shown in FIG. 2A, a structure is achieved such that a crucible lower stage 26 is provided under a crucible upper stage 21 with a crucible opening 25 opened at an edge of the crucible upper stage 21. The opening diameter of the crucible opening 25 is 500 μm to 10 mm. Although both the crucible upper stage 21 and the crucible lower stage 26 have the same crucible diameter, the height does not necessarily have to be the same. Although the stages are made of high heat-resistance ceramics such as alumina, the upper and lower stages do not necessarily have to be made of the same material.

Figure 4:
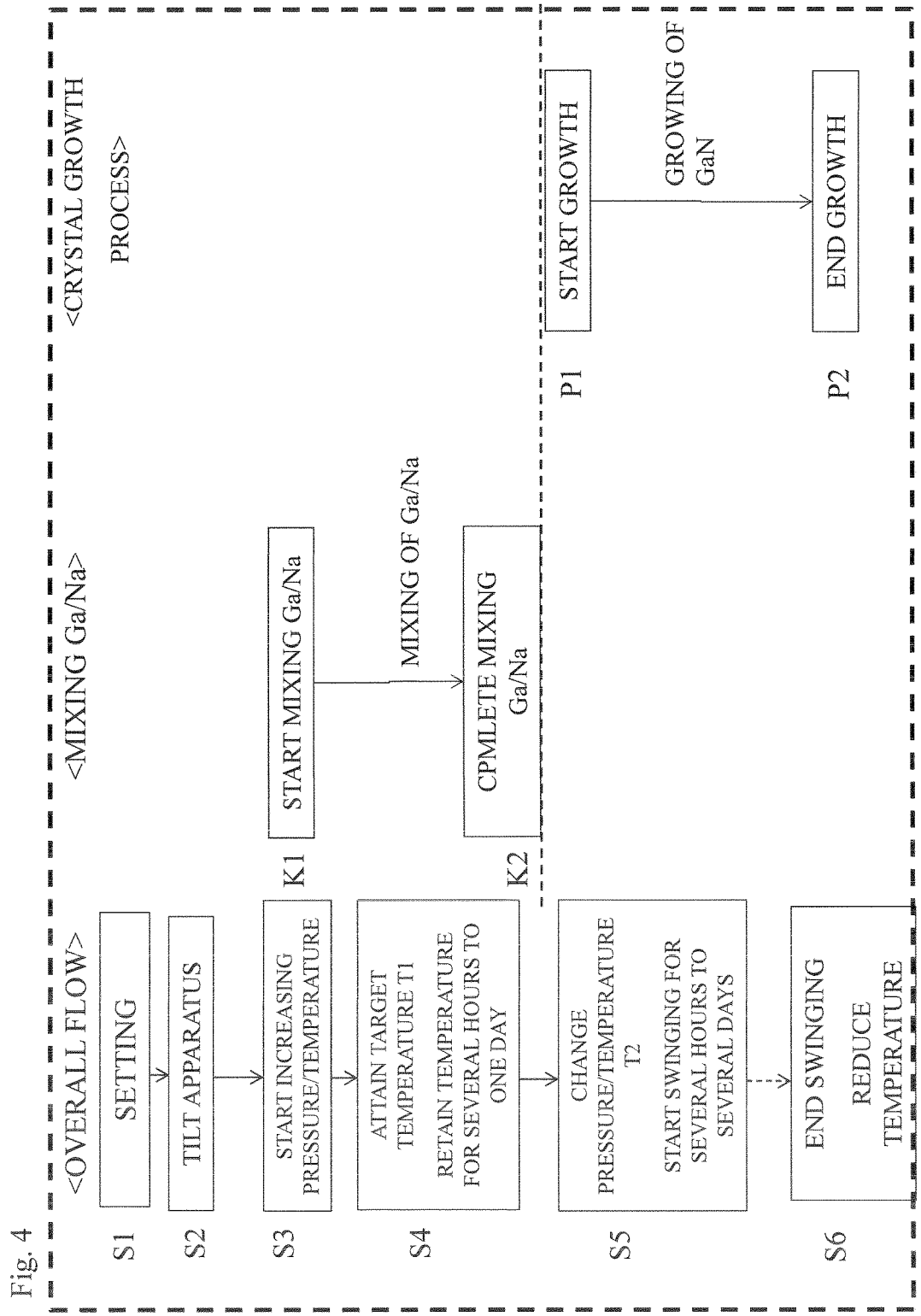
FIG. 4 is flowcharts of an overall flow of a GaN growth process with an Na flux method using the crucible having the upper and lower two-stage structure according to the first embodiment, a Ga/Na mixing process, and a crystal growth process.

With regard to the overall flow of the crystal production method of the present invention, a method of solving the crystal growth problem will be described with reference to FIG. 4. FIG. 4 is flowcharts of an overall flow of a GaN growth process with an Na flux method using the crucible 20 having the upper and lower two-stage structure according to the first embodiment, a Ga/Na mixing process, and a crystal growth process.

A process of mixing Ga/Na of S4 can be completed before crystal growth and a growth process of S5 can subsequently be performed by the crystal growth apparatus 100 including the crucible 20 having the two-stage structure of the present invention.

Specifically, in the crucible 20 having the two-stage structure of FIG. 2B, a Ga/Na mixing process K1, K2 can be performed in the crucible upper stage 21, and a growth process P1, P2 can be performed in the crucible lower stage 26. That is, the crucible upper stage 21 acts as a raw material supplying part that mixes raw materials, and the crucible lower stage 26 acts as a growing part having a seed substrate. Therefore, by using the crucible 20 having the two-stage structure, the Ga/Na mixing process K1, K2 and the growth process P1, P2 can clearly separately be performed.

The processes of S1, S2, and S3 are the same as the referential crystal production method shown in FIG. 1.

In the process of attaining a set temperature T1 at S4, Ga/Na are mixed with each other in the crucible upper stage 21 and, after the temperature T1 is attained, the mixing process is completed in several hours to one day, and an alloy is formed. In this period, a Ga/Na mixed liquid does not come into contact with a GaN seed substrate and, therefore, the crystal growth is not started.

Subsequently, at S5, after the growth temperature T2 is attained, the growth process is started. Since the liquid already completely mixed and uniformly containing nitrogen comes into contact with the seed substrate in this case, the initial crystal growth is uniformly achieved and the growth defect is eliminated. By swinging the entire apparatus, the supply of gallium and nitrogen is stabilized and the crystal growth is made uniform.

Specific detailed procedures will be described with reference to FIGS. 3A to 3D. Although a to d are added to respective reference numerals in the figures, differences of these alphabet characters have no particular meaning (e.g., 37a, 37b, 37c, and 37d denote the same structure).

FIG. 3A is a side sectional view of a state in which raw materials 32a, 33a are set in the two-stage structure crucible of the crystal growth apparatus 100.

First, a method of setting the raw materials 32a, 33a in the two-stage structure crucible of the crystal growth apparatus 100 will be described with reference to FIG. 3A. A crucible upper stage 31a is a mechanism of mixing Ga and Na, and the gallium 32a and the sodium 33a are placed in a closed container 37a. The closed container 37a is designed such that only the hand can be put therein. The inside of the closed container 37a is filled with an inert gas such as argon gas and the concentration of oxygen causing a crystal defect is kept extremely low. A crucible opening 34a is opened in the crucible upper stage 31a and, when the gallium 32a and the sodium 33a are placed, this crucible opening 34a is avoided. A seed substrate 36a is placed in a crucible lower stage 35a. The crucible lower stage 35a includes a mechanism of fixing the seed substrate 36a. This is because the substrate is immovably fixed since the entire device is tilted in a subsequent process.

Figure 3B:
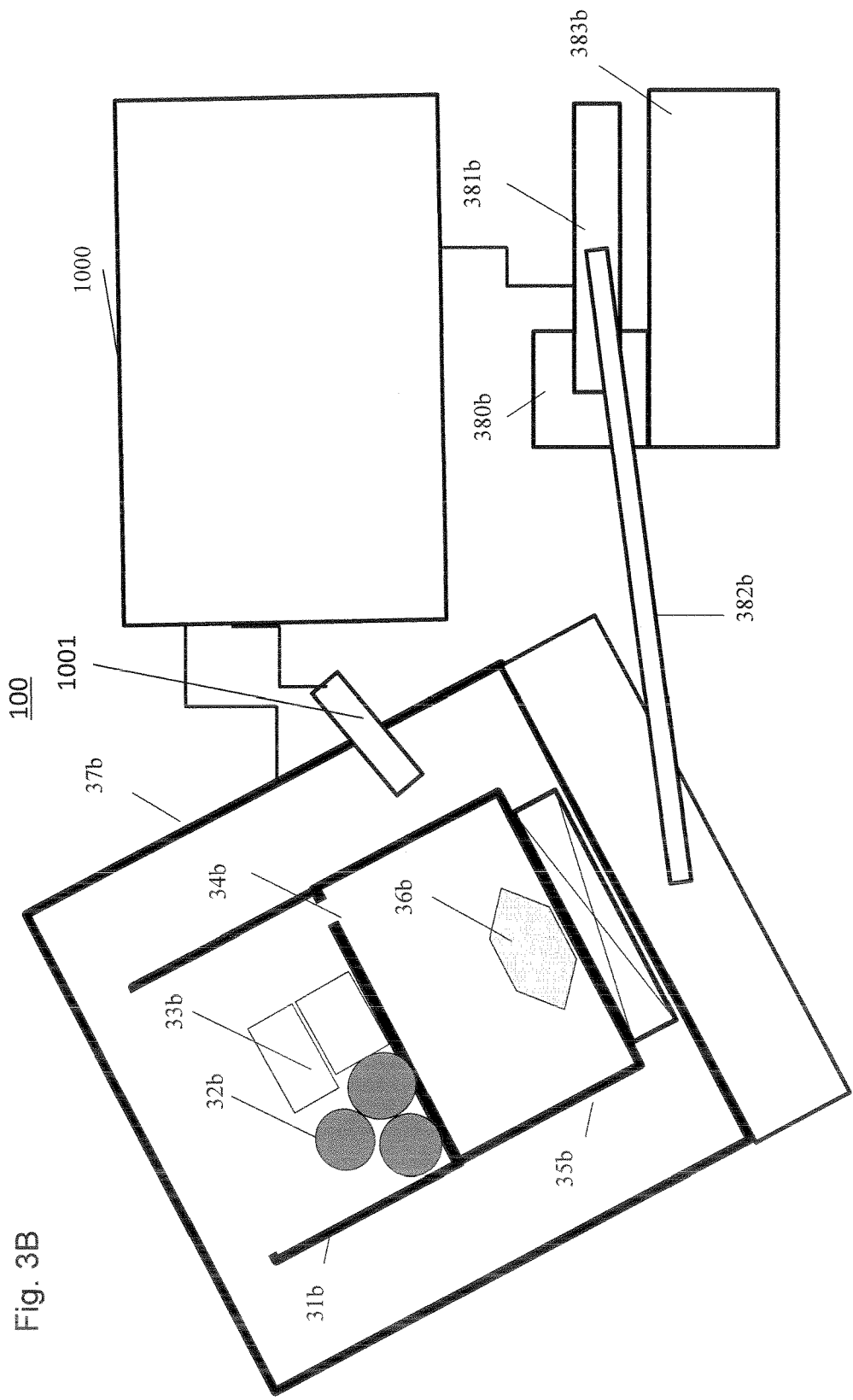
FIG. 3B is a side sectional view of a state in which the two-stage structure crucible is tilted.

FIG. 3B is a side sectional view of a state in which the two-stage structure crucible is tilted. In this state, the crucible upper stage 31a is placed. The crucible is put in a pressure vessel 37b as shown in FIG. 3B. When the crucible is put in the pressure vessel 37b, the entire apparatus is tilted and this state is held before putting in the crucible. The tilt angle is several degrees to 30 degrees depending on amounts of the gallium 32b and the sodium 33b. In particular, the gallium 32b and the sodium 33b turning into liquid metal at high temperature must be prevented from spilling out of the crucible opening 34b at the time of tilting. This operation is quickly performed because of a possibility of being exposed to oxygen.

A method of tilting the apparatus will be described with reference to FIGS. 3A-3D. As shown in FIG. 3A, this apparatus 100 has a mechanism including a motor 380a, a rotating lead rod 381a, a tilting lead rod 382a, and a stage 383a, and the apparatus is connected to the tilting lead rod 382a. At the time of tilting, the motor 380a on the stage 383a is driven in one direction to rotate the rotating lead rod 381a. In this case, as shown in FIG. 3B, the rotation of the rotating lead rod 381b applies a force to this apparatus in the rightward direction through the tilting lead rod 382b, so that the device can be tilted. When the apparatus is tilted in the leftward direction, as shown in FIG. 3D, the motor 380d is driven to further rotate the rotating lead rod 381d. In this case, a force is applied leftward to this apparatus through the tilting lead rod 382d, so that the apparatus can be tilted.

Figure 3C:
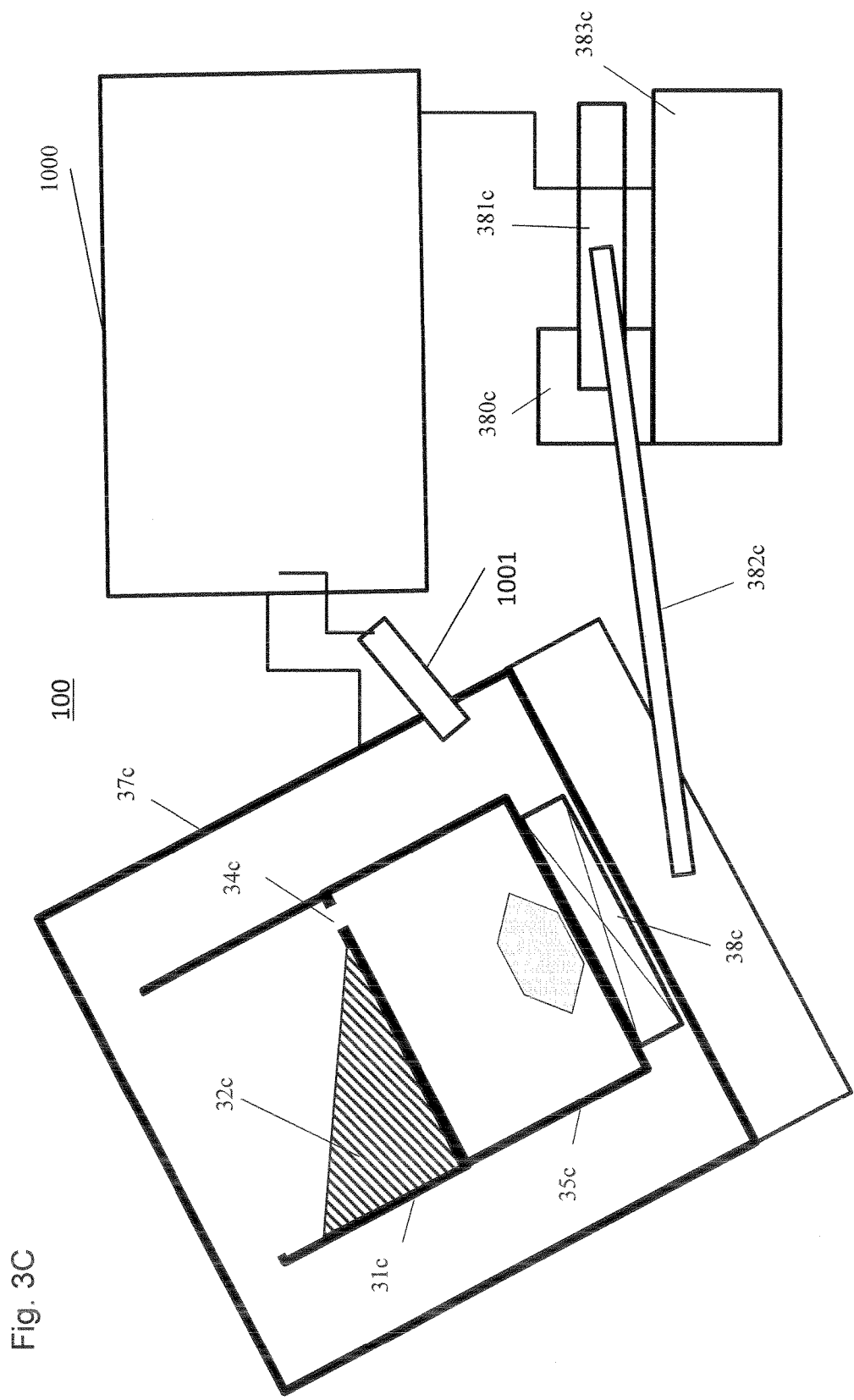
FIG. 3C is a side sectional view of a Ga/Na mixing process using the two-stage structure crucible.

A Ga/Na mixing process will be described with reference to FIG. 3C. FIG. 3C is a side sectional view of the Ga/Na mixing process using the two-stage structure crucible.

After vacuum replacement and nitrogen replacement are performed several times so as to remove an oxygen component in the pressure vessel 37c, replacement with nitrogen atmosphere is achieved and a pressure is applied. The pressure in this case is applied at 30 to 60 atmosphere as in the referential case. In this state, the temperature rise is started by using a heater 38c. In the figures, the heater 38c is disposed only at a bottom portion; however, a heater may be disposed also on a side surface because of soaking of the crucible. For example, if the set achieving temperature is 900° C., both gallium and sodium start liquefying when exceeding 100° C. and form a mixed liquid 32c.

In this case, since the amount of the mixed liquid 32c is measured in advance and is designed so as not to spill down to the crucible lower stage 35c from the crucible opening 34c and, therefore, the crucible upper stage 31a is held. This state is kept until the target temperature of 900° C. and retained for one hour or more to less than one day.

Although gallium and sodium are initially not sufficiently mixed and are distributed in the mixed liquid 32c, thermal convection and diffusion occur in the process of retaining at the high temperature, resulting in a sufficiently mixed alloy state. Additionally, because of being in the high-pressure nitrogen atmosphere, nitrogen is sufficiently and uniformly contained in gallium and sodium. Because of the influence of being under the high pressure, vaporization of sodium is sufficiently suppressed and a composition ratio of gallium and sodium is also maintained.

Figure 3E:
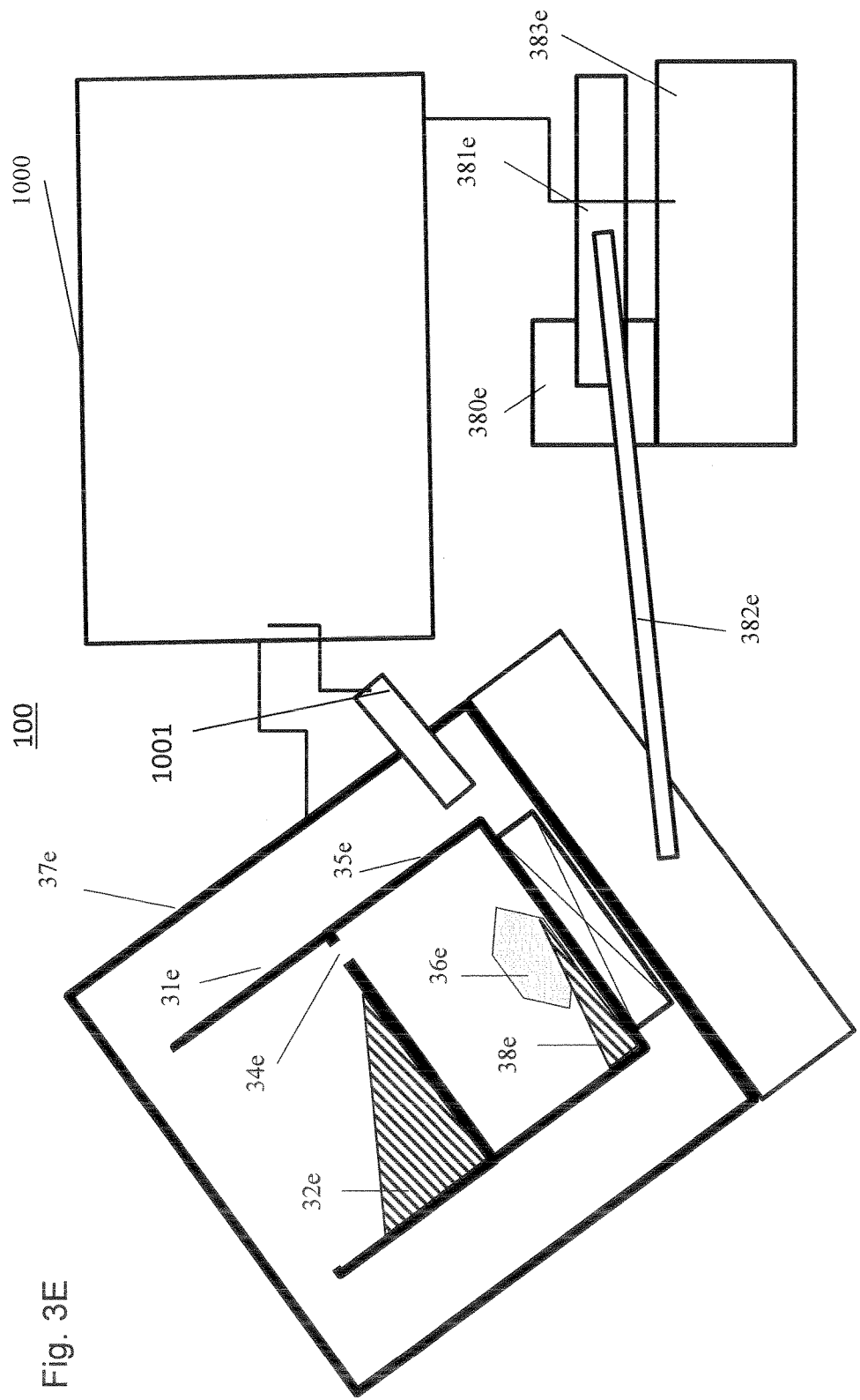
FIG. 3E is a side sectional view of the dropping and growing process using the two-stage structure crucible.

A dropping and growing process will be described with reference to FIGS. 3D and 3E. FIGS. 3D and 3E are side sectional views of the dropping and growing process using the two-stage structure crucible.

After the holding for mixing is completed, necessary changes for growth are made in pressure and temperature. Although the temperature during mixing is often made higher as compared to growing so as to increase the solubility of nitrogen in the mixed liquid, the pressure/temperature in the dropping and growing process may be the same as those during mixing.

After the set pressure/temperature are attained, the entire device is allowed to start swinging leftward and rightward. The pressure vessel 37c tilted at several degrees to 30 degrees in FIG. 3C is tilted on the opposite side also at several degrees to 30 degrees as in FIG. 3D. In this state, the Ga/Na mixed liquid 32d flows down from the crucible opening 34d of the crucible upper stage 31d to the crucible lower stage 35d. Gallium has a surface tension during mixing much larger than that of water and therefore is difficult to drop as liquid. Therefore, the mixed liquid is dropped by its own weight when being tilted. In this state, the mixed liquid 32d is entirely dropped into the crucible lower stage 35d in one minute to one hour. The dropping speed depends on a crucible size, amounts of introduced gallium and sodium. The speed also depends on the tilt angle. Although the state of FIG. 3D may be kept until the liquid is completely dropped, the liquid is desirably dropped while the entire apparatus is allowed to swing.

Specifically, the state is alternately changed to a tilted side on which the liquid is dropped from the crucible upper stage 31d as shown in FIG. 3D and to a tilted side on which the mixed liquid 32e is not dropped from the crucible upper stage 31d while an already dropped mixed liquid 38e is allowed to flow to the seed substrate 36e in the crucible lower stage 35e as shown in FIG. 3E. Therefore, the process of dropping and the process of flowing to the substrate are preferably alternately performed.

Figure 5:
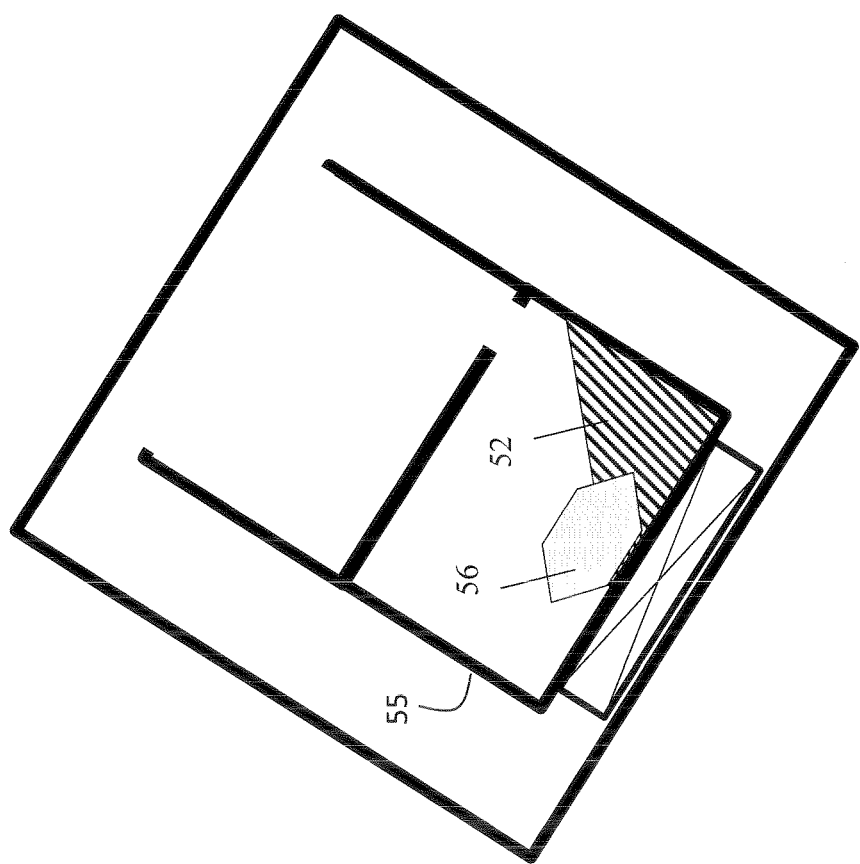
FIG. 5 is a side sectional view of a state in which the whole of a mixed liquid is dropped to a crucible lower stage.

An advantage of swinging the entire crystal growth apparatus 100 will be described with reference to FIG. 5. FIG. 5 is a side sectional view of a state in which the whole of a mixed liquid 52 is dropped to a crucible lower stage 55.

First, with respect to dropping of the mixed liquid 52, if the dropping is performed without swinging while a certain tilt angle is kept, the mixed liquid 52 may possibly come into contact with a portion of a seed substrate 56 as shown in FIG. 5. Since the initial growth of crystal growth starts in a few minutes as described above, the initial growth may possibly occur first at the position of contact between the mixed liquid 52 and a portion of the seed substrate 56.

This can be avoided by sufficiently increasing the size of the crucible relative to the seed substrate 56 so as not to allow the mixed liquid 52 to come into contact with a portion of the seed substrate 56; however, the entire apparatus is increased in size. Alternatively, an amount of the sodium/gallium liquid can be reduced to prevent the mixed liquid 52 from coming into contact with a portion of the seed substrate 56; however, the amount of the gallium material is reduced and a sufficient growth amount cannot be acquired.

Therefore, from the viewpoint of the initial growth, it is more preferable to swing the apparatus such that the mixed liquid 32d is dropped from the crucible upper stage 31d to the crucible lower stage 35d as shown in FIG. 3D while the mixed liquid 32e is allowed to come into contact with the entire surface of the seed substrate 36e as shown in FIG. 3E.

Additionally, swinging makes the supply of nitrogen to the substrate more effective. Nitrogen is filled in the pressure vessel 37a to 37d and contained in the mixed liquid 32d under high pressure. Nitrogen is supplied from a supply port 1001. The supplied nitrogen is preferably a nitrogen element containing substance containing the nitrogen element. Preferably, a nitrogen gas is supplied from the supply port 1001. When the dropping starts and the crystal growth begins between the mixed liquid 38e and the seed substrate 36e in the crucible lower stage 35e, the seed substrate 36e takes in gallium and nitrogen contained in the mixed liquid 38e. If the swinging is not performed, the amounts of gallium and nitrogen around the substrate are relatively reduced, and the amounts of gallium and nitrogen taken in become insufficient, so that the growth speed drops. By performing the swinging, the mixed liquid 38e is stirred and, in this case, gallium is mixed again and nitrogen in the pressure vessel 37e is supplied again to the mixed liquid 38e. As a result, gallium and nitrogen are stably supplied to the seed substrate 36e.

For the reasons described above, the crystal is stably grown by swinging the apparatus. The speed of swinging is about several rpm, and the dropping of the liquid is completed in a few minutes. After the dropping is completed, as shown in FIG. 3E, only the crystal growing process of reacting the mixed liquid 38e with the seed substrate 36e is performed. In a swinging method, tilting operations are alternately performed by moving the motor 380a of FIG. 3A for achieving the rightward tilt shown in FIG. 3C, subsequently further rotating the motor 380c for achieving the leftward tilt shown in FIG. 3D, and further rotating the motor 380d for achieving the rightward tilt. The crystal growth process takes 24 hours or more, or if it takes longer, five days or more. When the crystal growth process is finished, the swinging of the apparatus is stopped, and the set temperature is set to normal temperature to reduce the temperature inside the apparatus. After several hours, when the inside of the apparatus becomes normal temperature, the crucible and the substrate are taken out.

As described above, by achieving the two-stage crucible structure, the mixing process and the crystal growth process can be separated and the raw materials can uniformly be supplied to the seed substrate so as to grow crystals uniformly in the plane.

Second Embodiment

A second embodiment will be described.

In the structure of the first embodiment, after dropping the mixed liquid to the crucible lower stage, the mixed liquid is brought into contact with the seed substrate by swinging so as to make the crystal growth uniform.

However, the viscosity of gallium is about 10 times as high as that of liquid such as water, and the mixed liquid is considered to have high viscosity at high temperature. In this case, it is considered that the mixed liquid hardly flows, and even if the swinging is performed at several rpm, the mixed liquid may not come into sufficient contact with the seed substrate in the crucible lower stage and, as a result, the initial growth may not become uniform. Therefore, a mechanism is also required in some cases for making the dropping uniform during swinging.

For making the dropping uniform, the present inventor invented a crystal growth apparatus including a crucible 60 having an upper, middle, and lower three-stage structure.

Figure 6:
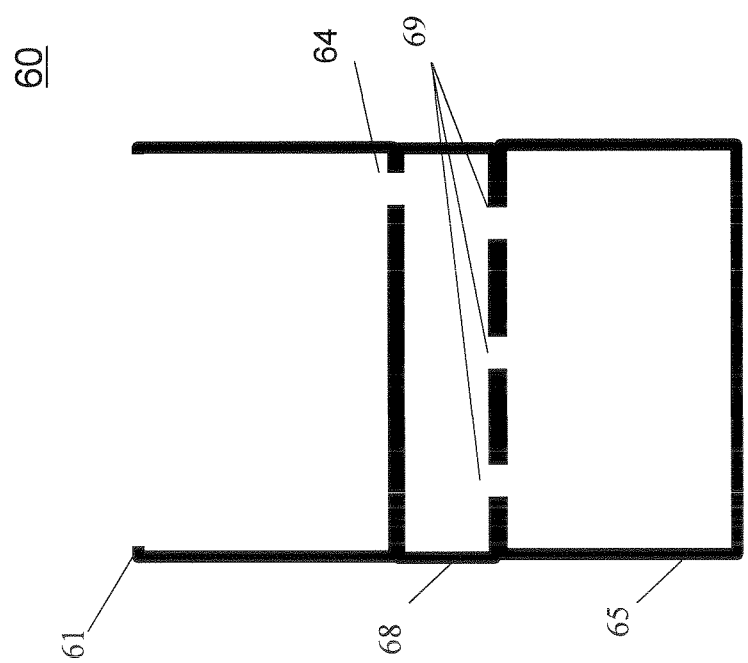
FIG. 6 is a side sectional view of a cross-sectional structure of a crucible having an upper, middle, and lower three-stage structure according to a second embodiment.

FIG. 6 is a side sectional view of a cross-sectional structure of the crucible 60 having the upper, middle, and lower, three-stage structure according to the second embodiment. The structure thereof will be described with reference to FIG. 6.

This upper, middle, and lower three-stage crucible 60 is characterized by the presence of a crucible middle stage 68 between a crucible upper stage 61 and a crucible lower stage 65. A crucible opening 64 is provided at an edge of the crucible upper stage 61, and the opening diameter thereof is 500 μm to 10 mm. A plurality of crucible openings (middle stage) 69 is present in the crucible middle stage 68 and is not constant in terms of opening size and opening arrangement position in the crucible plane. Although the crucible upper stage 61, the crucible lower stage 65, and the crucible middle stage 68 have the same crucible diameter, the height does not necessarily have to be the same. Although the middle stage may be made of alumina ceramics etc. as is the case with the upper and lower stages, the upper, middle, and lower stages do not necessarily have to be made of the same material.

A method of solving the problem by a crystal growth apparatus including the crucible 60 having the upper, middle, and lower three-stage structure will be described with reference to FIG. 11.

Figure 11:
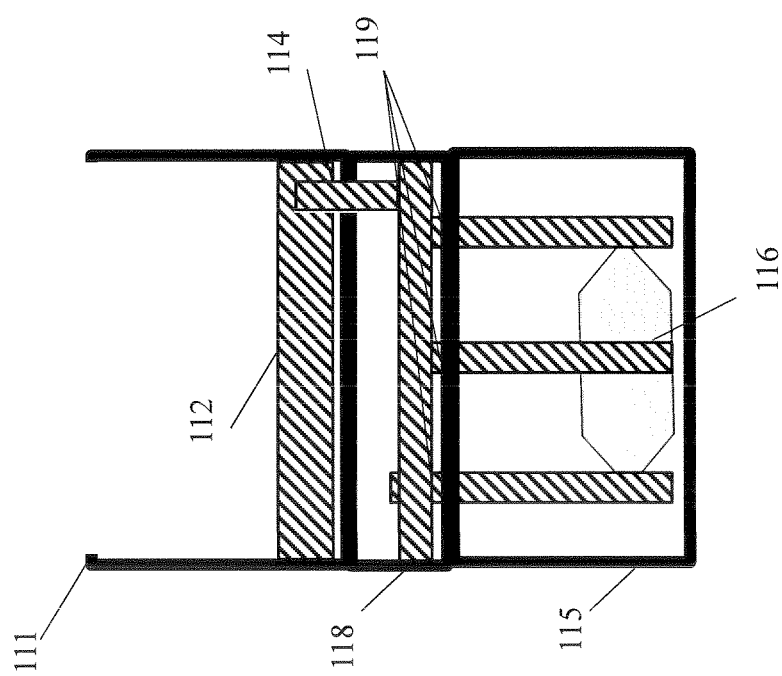
FIG. 11 is an image diagram at the time of dropping of a mixed liquid in the crucible having the upper, middle, and lower three-stage structure according to the second embodiment.

FIG. 11 is an image diagram at the time of dropping of a mixed liquid 112 in the crucible 60 having the upper, middle, and lower three-stage structure according to this structure. A crucible upper stage 111 is used for the purpose of mixing and holding, and a crucible lower stage 115 is used for the purpose of allowing the mixed liquid 112 to flow to a seed substrate 116. A crucible middle stage 118 is a mechanism for making the dropping uniform, and the mixed liquid 112 having entered the crucible middle stage 118 from the crucible upper stage 111 is dropped through crucible openings (middle stage) 119 to the crucible lower stage 115. Since a plurality of the crucible openings (middle stage) 119 is disposed, the dropping to the seed substrate 116 is configured to be uniform because of the number and the arrangement of the crucible openings.

Actual procedures will be described with reference to FIGS. 7A to 7E.

First, the setting of raw materials 72a, 73a into a crucible 70 having the upper, middle, and lower three-stage structure will be described with reference to FIG. 7A.

Figure 7B:
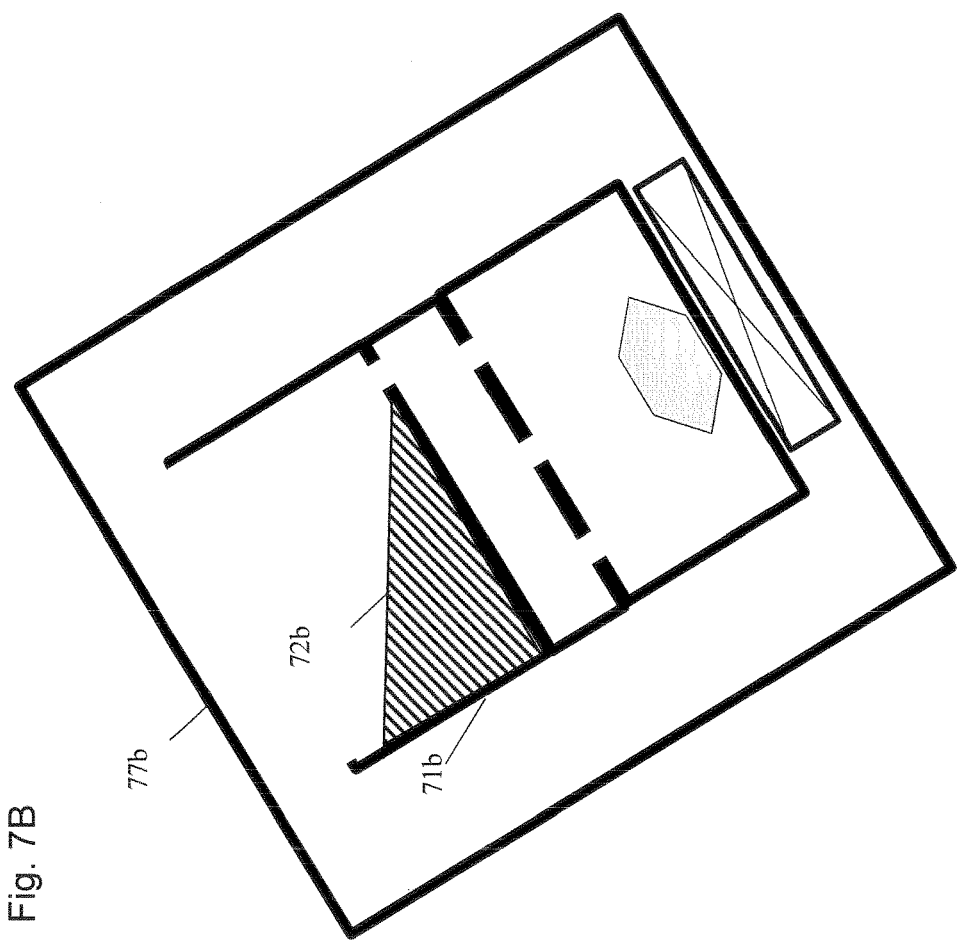
FIG. 7B is a side sectional view of a state in which raw materials are melted and mixed while the crucible of FIG. 7A is tilted.
Figure 7A:
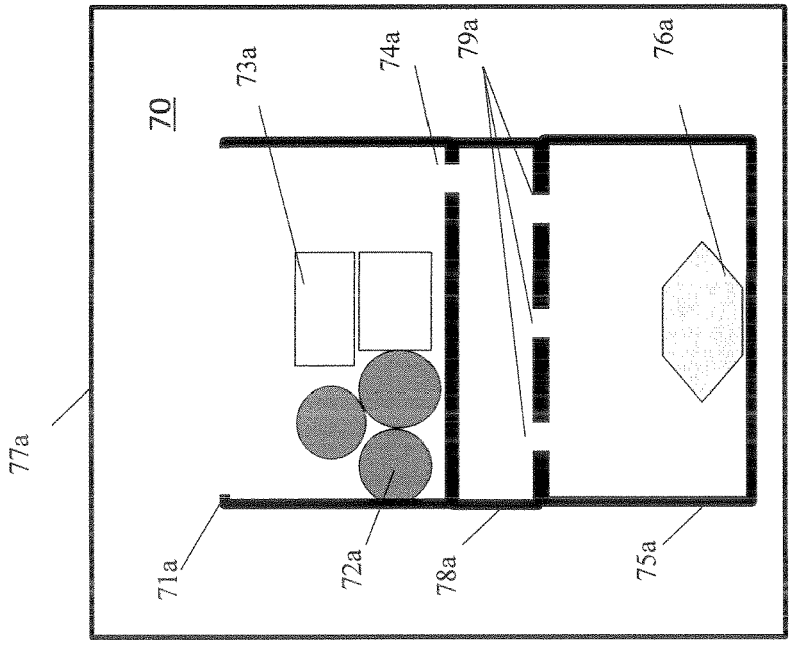
FIG. 7A is a side sectional view of a state in which raw materials are held in a crucible upper stage of the crucible having the upper, middle, and lower three-stage structure.

FIG. 7A is a side sectional view of a state in which the raw materials 72a, 73a are held in a crucible upper stage 71a of the crucible 70 having the upper, middle, and lower three-stage structure.

As shown in FIG. 7A, the crucible 70 is put into a closed container 77a and, in the closed container 77a, gallium 72a and sodium 73a are placed in the crucible upper stage 71a and a seed substrate 76 a is placed on a crucible lower stage 75a. Nothing is placed in a crucible middle stage 78a at the time of setting.

In this state, the upper, middle and lower stages are stacked in three stages, and the crucible 70 having the upper, middle, and lower three-stage structure is taken out of the closed container 77a.

FIG. 7B is a side sectional view of a state in which raw materials are melted and mixed to form a mixed liquid 72b while the crucible 70 having the upper, middle, and lower three-stage structure of FIG. 7A is tilted. As shown in FIG. 7B, the crucible is placed in the tilted pressure vessel 77b. The tilt angle is several degrees to 30 degrees as is the case with the first embodiment. In this state, pressure and temperature are applied to form the mixed liquid 72b in the crucible upper stage 71b as in the first embodiment.

The dropping of the mixed liquid during swinging will be described with reference to FIGS. 7C, 7D, and 7E.

Figure 7E:
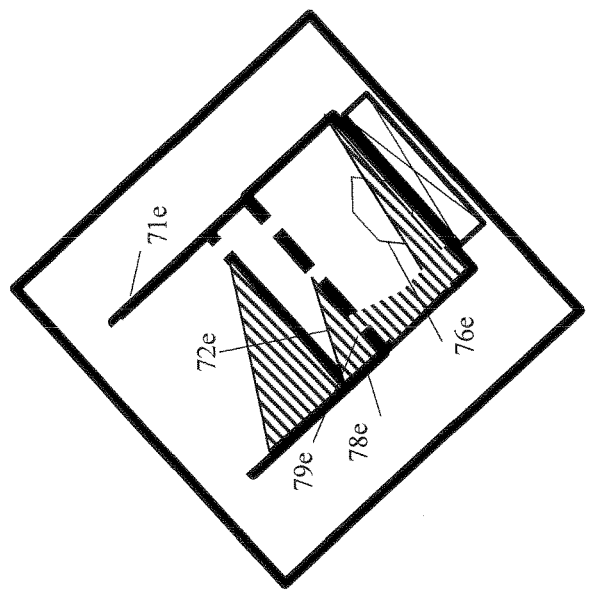
FIG. 7E is a side sectional view of the dropping and growing process using the crucible having the upper, middle, and lower three stage structure.
Figure 7D:
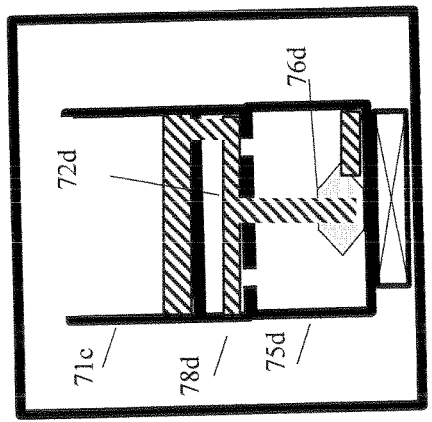
FIG. 7D is a side sectional view of the dropping and growing process using the crucible having the upper, middle, and lower three stage structure.
Figure 7C:
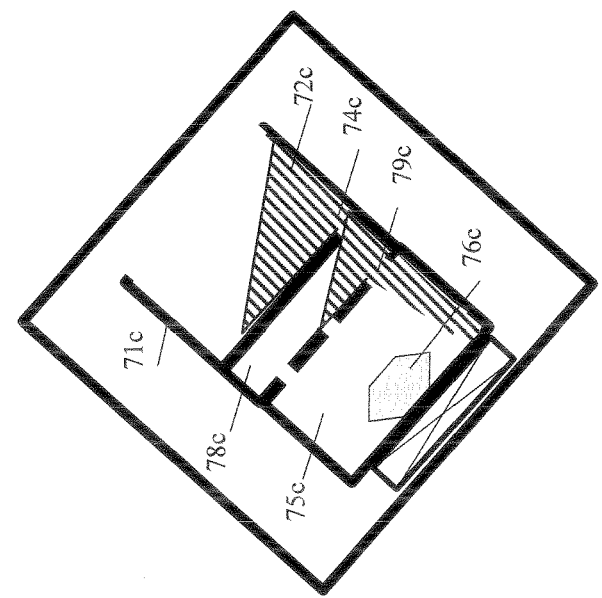
FIG. 7C is a side sectional view of a dropping and growing process using the crucible having the upper, middle, and lower three stage structure.

FIGS. 7C, 7D, and 7E are side sectional views of the dropping and growing process using the crucible 70 having the upper, middle, and lower three-stage structure.

When the mixing process is completed and the growing process is started, the crucible is allowed to start swinging. As shown in FIG. 7C, when coming to a tilted position on the side opposite to the initial holding position, a mixed liquid 72c is dropped from a crucible opening (upper stage) 74c to a crucible middle stage 78c. In this case, a portion of the mixed liquid 72c is dropped from a crucible opening (middle stage) 79c on the right side of the crucible middle stage 78c to a crucible lower stage 75c. The dropped mixed liquid 72c comes into contact with the seed substrate 76c from an edge thereof.

When the swinging direction is shifted to the opposite direction and the tilt of the container is gradually eliminated as shown in FIG. 7D, the mixed liquid 72d accumulated in the crucible middle stage 78d is also dropped also from central openings of the crucible openings (middle stage) 79d. In this case, the mixed liquid 72d is dropped to the center of the seed substrate 76d.

When the swinging direction further moves to the edge and a tilt is formed as shown in FIG. 7E, the mixed liquid 72e accumulated in the crucible middle stage 78e is dropped from an edge of the crucible openings (middle stage) 79e. In this case, the mixed liquid 72e comes into contact with the seed substrate 76e from the left edge thereof. The mixture liquid 72e dropped from the crucible middle stage 78e is replenished from the crucible upper stage 71c when coming to the position of FIG. 7C again during swinging, and is dropped when moving to the places of FIGS. 7D and 7E.

Figure 9:
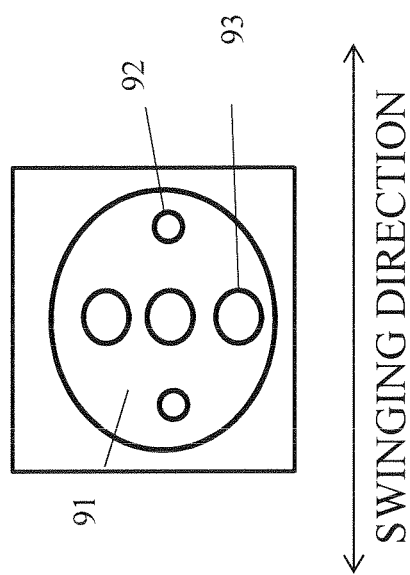
FIG. 9 is an explanatory view of crucible openings of the upper, middle, and lower three-level structure.

The structure of the crucible openings (middle stage) 79e will be described in detail with reference to FIGS. 8 and 9.

Figure 8:
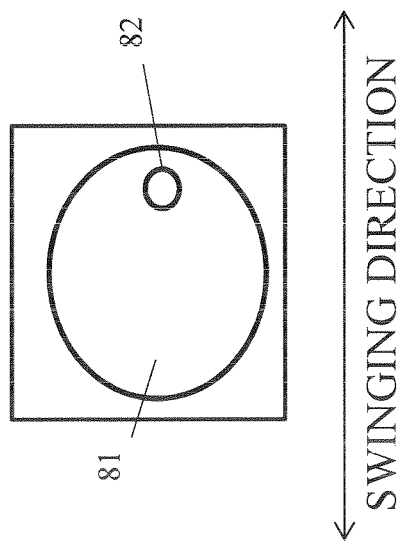
FIG. 8 is a view of a structure of a crucible opening described in the first embodiment observed from above the crucible.

FIG. 8 is a view of a structure of a crucible opening 82 described in the first embodiment observed from above the crucible. When the crucible is tilted to one side, the mixed liquid is dropped from the crucible opening 82. FIG. 9 is a view of the opening structure of the crucible middle stage according to the second embodiment. Openings 92 on the left and right edges are small and openings in a central portion 93 are large with respect to the direction of swinging.

The reason why the size of the openings is changed in relation to the position in the swinging direction is that the amount dropped from the crucible middle stage is different between both edges and the central portion. Since the swinging tilt becomes large at the right and left edges, the mixed liquid's own weight is greatly applied to the crucible opening 92. Additionally, since the swinging speed is reduced, the dripping time is long. Therefore, the mixed liquid easily drops at the left and right edges. On the other hand, because the tilt is small at the center of swinging, the mixed liquid's own weight is small, and the speed becomes fast so that the dripping time is short. Therefore, the mixed liquid is difficult to drop at the center.

From the above, in the crucible middle stage 91, while the opening diameter is made smaller at the right and left edges, the opening diameter is made larger and the number of openings is increased at the center as compared to the left and right edges so as to control the dropping amount.

The diameters of the crucible openings 92 and the crucible openings 93 are made such that one diameter is twice as large as the other diameter, for example. Alternatively, the size of the crucible openings 92 at the right and left edges can be regulated such that the mixed liquid drops at the right and left edges of swinging without dropping at the center of swinging.

As described above, by forming the crucible into the upper, middle, and lower three-stage structure and changing the size and the number of the crucible openings of the middle stage in accordance with the swinging direction, the mixed liquid can uniformly be dropped onto the seed substrate, and as a result, the crystal growth of the GaN substrate can be made uniform.

Third Embodiment

A third embodiment will be described.

In the first and second embodiments, Ga and Na are held for mixing in the crucible upper stage for several hours with pressure/temperature applied in a tilted pressure vessel.

However, holding in a tilted state may generate a temperature gradient on the seed substrate. When the temperature is increased by a heater, thermal convection occurs in the pressure vessel, and a heat rises to generate a thermal gradient in a vertical direction in the vessel. The temperature gradient due to the heat during tilting also affects the seed substrate and may make the crystal growth non-uniform.

Therefore, it is necessary to mix Ga and Na without tilting.

Thus, the present inventor invented an apparatus enabling mixing of Ga, Na without tilting so as to reduce the temperature gradient.

Figure 10:
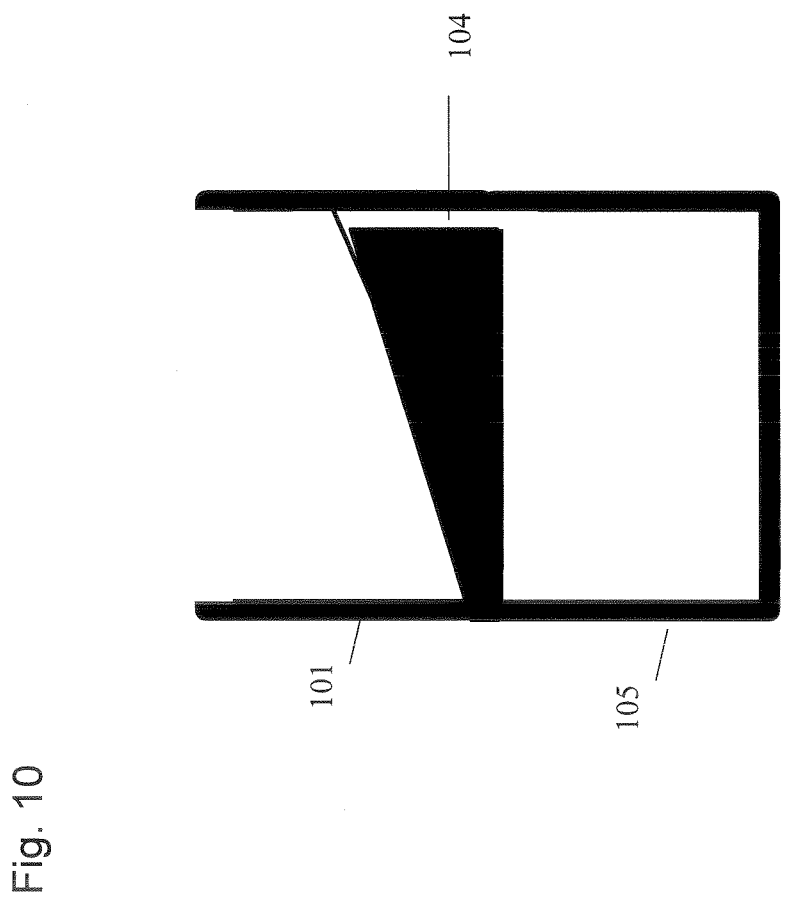
FIG. 10 is a side sectional view of a cross-sectional structure of a crucible having a slope in a crucible upper stage according to a third embodiment.

The structure thereof will be described with reference to FIG. 10. FIG. 10 is a side sectional view of a cross-sectional structure of a crucible having a slope in a crucible upper stage according to the third embodiment. In a crucible upper stage 101, a structure is formed with a bottom portion formed into a slope. A crucible opening 104 is formed on a surface at a right edge of this sloped bottom. The crucible opening diameter is 500 μm to 10 mm.

The apparatus is characterized by a structure in which the bottom portion is sloped to hold gallium and sodium on the surface thereof so that gallium and sodium liquefied at high temperature do not flow down from the crucible opening 104 even without tilting the entire device.

A specific setting will be described with reference to FIGS. 12A and 12B.

Figure 12A:
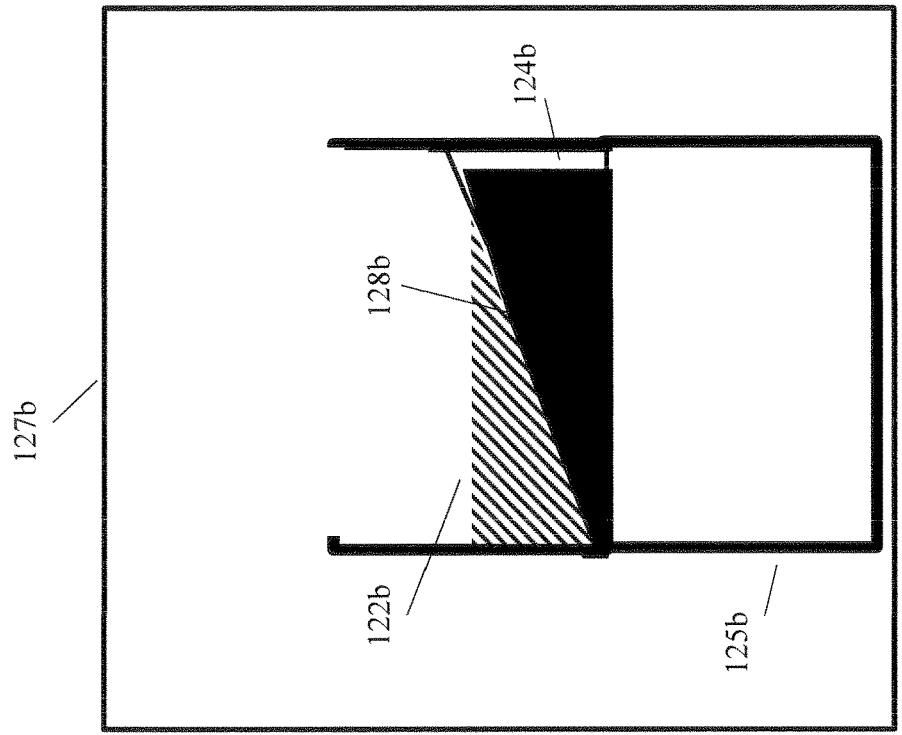
FIG. 12A is a side sectional view of a state in which raw materials are held in a crucible having a slope in a crucible upper stage.

FIG. 12A is a side sectional view of a state in which raw materials are set in a crucible having a slope in a crucible upper stage. FIG. 12B is a side sectional view of a state in which the raw materials are melted and mixed in the crucible having a slope in a crucible upper stage of FIG. 12A.

As shown in FIG. 12A, sodium 122a and gallium 123b are set in a crucible slope part 128a in a closed container 127a. The amounts of the sodium 122a and the gallium 123b are adjusted to prevent flowing down from a crucible opening 124a after liquefaction.

Figure 12B:
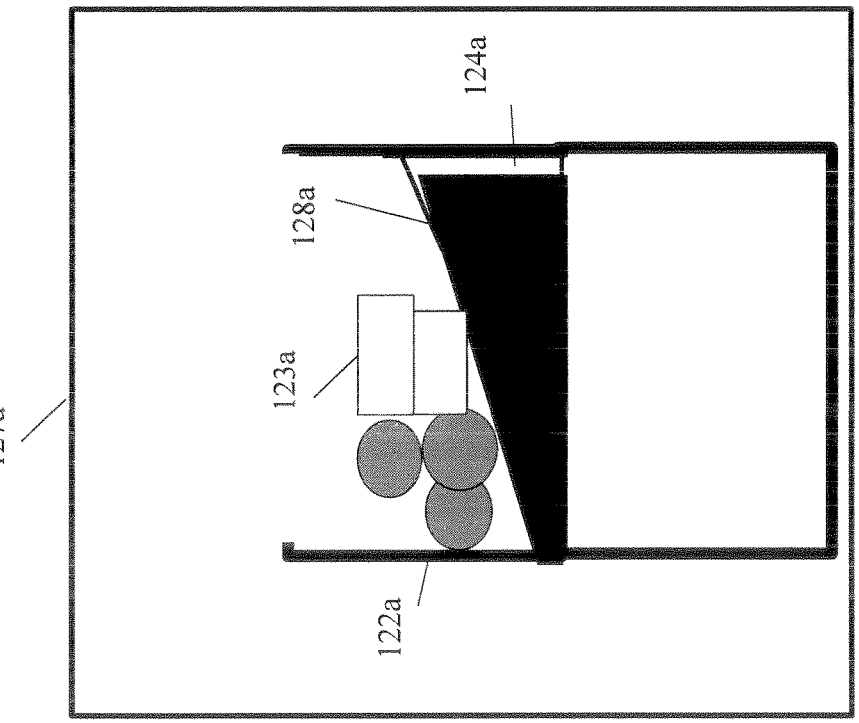
FIG. 12B is a side sectional view of a state in which the raw materials are melted and mixed in the crucible having a slope in a crucible upper stage of FIG. 12A.

As shown in FIG. 12B, pressure and temperature are applied in the pressure vessel 127b as in the first and second embodiments. In this case, a mixed liquid 122b does not flow down to the crucible opening 124b and is held by the crucible slope part 128b. By swinging as is the case with the first and second embodiments, the mixed liquid is dropped into a crucible lower stage 125b.

As described above, by sloping the crucible structure, the temperature gradient of the seed substrate can be reduced and the non-uniform crystal growth can be prevented without tilting and holding the entire device so as to hold the gallium/sodium mixed liquid.

A group III element metal is most preferably gallium (Ga) and may be, for example, aluminum (Al), indium (In), and thallium (Tl), and only one kind or a combination of two or more kinds thereof may be used. For example, at least one selected from the group consisting of aluminum (Al), gallium (Ga), and indium (In) may be used as the group III element metal. In this case, the composition of the group III nitride crystal to be produced is represented by $Al_sGa_tIn_{\{1-(s+t)\}}N$ (where $0 \leq s \leq 1$, $0 \leq t \leq 1$, $s+t \leq 1$). Additionally, for example, a dopant material etc. may coexist, and may be reacted, with a group III element metal 110. The dopant is not particularly limited and may be germanium oxide (e.g., $Ge_2O_3$, $Ge_2O$) etc.

Examples of nitride crystals of a ternary or higher system produced by using two or more kinds of the group III element metal include, for example, crystals of $Ga_xIn_{1-x}N$ ($0<x<1$).

For alkali metal, in addition to or instead of sodium, other alkali metals such as lithium may be used. More specifically, the alkali metal includes at least one selected from the group consisting of lithium (Li), sodium (Na), potassium (K), rubidium (Rb), cesium (Cs), and francium (Fr) and may be, for example, a mixed flux of Na and Li. It is particularly preferable that the alkali metal be sodium. The alkali metal may or may not contain one or more components other than alkali metal.

The components other than the alkali metal are not particularly limited and include, as alkaline earth metals, for example, calcium (Ca), magnesium (Mg), strontium (Sr), barium (Ba), and radium (Ra) and, among these, Ca and Mg are preferable and Ca is more preferable.

Additionally, for the components other than the alkali metal, for example, carbon (carbon simple substance or carbon compound) may or may not be included. A carbon simple substance and a carbon compound generating cyanide (CN) in a material containing the alkali metal is preferable. Carbon may be a gaseous organic substance. Examples of such carbon simple substance and carbon compound include cyanide, graphite, diamond, fullerene, carbon nanotube, methane, ethane, propane, butane, benzene, etc. The content of the carbon is not particularly limited and is, based on the total of the melt, the group III element, and the carbon, for example, within the range of 0.01 to 20 atomic (at.) %, the range of 0.05 to 15 atomic (at.) %, the range of 0.1 to 10 atomic (at.) %, the range of 0.1 to 5 atomic (at.) %, the range of 0.25 to 7.5 atomic (at.) %, the range of 0.25 to 5 atomic (at.) %, the range of 0.5 to 5 atomic (at.) %, the range of 0.5 to 2.5 atomic (at.) %, the range of 0.5 to 2 atomic (at.) %, the range of 0.5 to 1 atomic (at.) %, the range of 1 to 5 atomic (at.) %, or the range of 1 to 2 atomic (at.) %. Among these, a preferable range is the range of 0.5 to 5 atomic (at.) %, the range of 0.5 to 2.5 atomic (at.) %, the range of 0.5 to 2 atomic (at.) %, the range of 0.5 to 1 atomic (at.) %, the range of 1 to 5 atomic (at.) %, or the range of 1 to 2 atomic (at.) %.

The addition ratio of the alkali metal to the group III element metal is, for example, 0.1 to 99.9 mol %, preferably 1 to 99 mol %, more preferably 5 to 98 mol %. When a mixed flux of the alkali metal and the alkaline earth metal is used, the molar ratio is, for example, alkali metal: alkaline earth metal=99.99 to 0.01:0.01 to 99.99, preferably 99.9 to 0.05:0.1 to 99.95, more preferably 99.5 to 1:0.5 to 99. The purity of the melt is preferably high. For example, the purity of Na is preferably a purity of 99.95% or more. For a high-purity flux component (e.g., Na), a commercially available high-purity product may be used, or a purchased commercially available product may be increased in purity by distillation etc. before use.

The reaction temperature and pressure of the group III element and the nitrogen-containing gas are also not limited to the numerical values described above and may be set as needed. Appropriate reaction temperature and pressure vary depending on the components of the melt (flux), the atmospheric gas component and the pressure thereof and are, for example, a temperature of 100 to 1500° C. and a pressure of 100 Pa to 20 MPa, preferably a temperature of 300 to 1200° C. and a pressure of 0.01 MPa to 20 MPa, more preferably a temperature of 500 to 1100° C. and a pressure of 0.1 MPa to 10 MPa, and further preferably a temperature of 700 to 1100° C. and a pressure of 0.1 MPa to 10 MPa. Although the reaction time, i.e., the growing (growth) time of crystals is not particularly limited and may be set as needed such that the crystals grow to an appropriate size, the time is, for example, 1 to 1000 hours, preferably 5 to 600 hours, more preferably 10 to 400 hours.

A crystal production method of producing a crystal of a group III nitride such as GaN may be implemented by using each of the various crystal growth apparatuses described above.

The present disclosure includes appropriately combining arbitrary embodiments and/or examples of the various embodiments and/or examples described above, and the effects of the respective embodiments and/or examples can be produced.

The crystal growth apparatus and the crystal production method of the present disclosure enable proper mixing of raw materials and can be applied for the purpose of improving a growth yield in production of crystals of GaN etc.

The invention claimed is:

1. A crystal growth apparatus comprising:
a raw material supplying part configured to mix raw materials including a group III element metal and an alkali metal;
a growing part at a stage under the raw material supplying part, the growing part having a seed substrate;
a tilting mechanism configured to tilt the raw material supplying part and the growing part;
a heater configured to heat the raw material supplying part and the growing part;
a control part configured to control an operation of the tilting mechanism; and
a supply port configured to supply a nitrogen element-containing substance to the growing part,
wherein the raw material supplying part has an opening facing the growing part, the opening being defined at a bottom portion and a first edge portion of the raw material supplying part,
wherein the control part is configured to control the tilting mechanism so as to tilt the raw material supplying part toward a second edge portion on a side opposite to the first edge portion so as to prevent the raw materials from entering the opening when the raw materials are mixed, and
wherein the control part is further configured to control the tilting mechanism so as to tilt the raw material supplying part toward the first edge portion so that the raw materials drop through the opening to the growing part when the mixing of the raw materials is completed.

2. A crystal production method including:
preparing a crystal growth apparatus including: a raw material supplying part configured to mix raw materials including a group III element metal and an alkali metal; a growing part at a stage under the raw material supplying part, the growing part having a seed substrate; a tilting mechanism configured to tilt the raw material supplying part and the growing part; a heater configured to heat the raw material supplying part and the growing part; a control part configured to control an operation of the tilting mechanism; and a supply port configured to supply a nitrogen element-containing substance to the growing part, wherein the raw material supplying part has an opening facing the growing part, the opening being defined at a bottom portion and a first edge portion of the raw material supplying part, loading the raw materials including the group III element metal and the alkali metal into the raw material supplying part and loading the seed substrate into the growing part, tilting the raw material supplying part toward a second edge portion on a side opposite to the first edge portion so as to prevent the raw materials from entering the opening when the raw materials are mixed, tilting the raw material supplying part toward the first edge portion so that the raw materials drop through the opening to the growing part when the mixing of the raw materials is completed, and growing a group III nitride crystal on the seed substrate.

3. The crystal production method according to claim 2, wherein the crystal growth apparatus further includes a uniform dropping structure part between the raw material supplying part and the growing part, wherein the uniform dropping structure part has a plurality of crucible openings, and wherein the crystal growth apparatus is configured to cause the tilting mechanism to swing the uniform dropping structure part such that, after the raw materials are dropped through the opening to the uniform dropping structure part, the raw materials are supplied through the plurality of crucible openings to the growing part.

4. The crystal production method according to claim 3, wherein respective diameters of the plurality of crucible openings become smaller as a distance from a center of the uniform dropping structure part increases.

5. The crystal production method according to claim 2, wherein the group III element metal is Ga, and wherein the alkali metal is Na.

* * * * *